United States Patent
Beach et al.

(10) Patent No.: US 7,205,657 B2
(45) Date of Patent: Apr. 17, 2007

(54) COMPLIMENTARY LATERAL NITRIDE TRANSISTORS

(75) Inventors: Robert Beach, Altadena, CA (US); Paul Bridger, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 7 days.

(21) Appl. No.: 11/056,833

(22) Filed: Feb. 11, 2005

(65) Prior Publication Data

US 2005/0180231 A1 Aug. 18, 2005

Related U.S. Application Data

(60) Provisional application No. 60/544,910, filed on Feb. 12, 2004.

(51) Int. Cl.
*H01L 29/76* (2006.01)
*H01L 27/06* (2006.01)
*H01L 29/66* (2006.01)
*H01L 29/417* (2006.01)
*H01L 29/40* (2006.01)

(52) U.S. Cl. .............................. 257/724; 257/E27.015; 257/E29.121; 257/E29.262; 257/E21.696; 257/341; 257/342; 257/330; 257/333; 257/331; 257/347

(58) Field of Classification Search ................ 257/724, 257/343, 162, 401, 507, 146, 192, 194, 341, 257/342, 350, E27.023, E27.012, E27.015, 257/330, 331, 333, 347, E29.121, E29.262, 257/E21.696
See application file for complete search history.

(56) References Cited

U.S. PATENT DOCUMENTS 6,800,904 B2 * 10/2004 Fujishima et al. .......... 257/343
2005/0062111 A1 * 3/2005 Maldei et al. .............. 257/401

* cited by examiner

*Primary Examiner*—Alexander Oscar Williams
(74) *Attorney, Agent, or Firm*—Ostrolenk, Faber, Gerb & Soffen, LLP

(57) ABSTRACT

A semiconductor device which includes a laterally extending stack of laterally adjacent conductive semiconductor regions formed over a support surface of a substrate, and a method for fabricating the device.

21 Claims, 5 Drawing Sheets

COMPLIMENTARY LATERAL NITRIDE TRANSISTORS

RELATED APPLICATION

This application is based on and claims benefit of U.S. Provisional Application Ser. No. 60/544,910, filed Feb. 12, 2004, entitled COMPLIMENTARY LATERAL NITRIDE TRANSISTORS, to which a claim of priority is hereby made and the disclosure of which is incorporated by reference.

FIELD OF THE INVENTION

The present invention relates to semiconductor devices and more particularly to power semiconductor devices and methods for fabricating power semiconductor devices.

BACKGROUND OF THE INVENTION

A typical semiconductor fabrication process includes steps for deposition and or growth of a thin semiconductor film over a substrate and then forming features within the thin semiconductor film by a series of diffusion and deposition steps. For example, it is common to epitaxially grow a thin layer of silicon over a silicon substrate, which is usually cut out of an ingot, and then forming PN junctions within the thin layer to form the basic parts of a semiconductor device. Depending on the device other parts of the device can then be formed by a series of deposition and etching steps. For example, in a typical field effect transistor channel regions may be formed by implantation and diffusion dopants and the gate structures are formed adjacent the channel region by growing a gate oxide and deposition and patterning a conductive material to form the gate electrodes.

The conventional methods often include masking steps to define the areas that are to be implanted. The masks are formed lithographically and often include dimensional errors, even in well controlled processes.

Typically, design rules are often developed to reduce the adverse effects of such errors. Design rules, however, may unnecessarily call for larger dimensions in the mask in order to compensate for processing errors. Thus, features in a device may be larger than necessary, thereby consuming more material than ideally required.

In addition, forming a PN junction by diffusion involves implanting dopants of one conductivity in a semiconductor body of another conductivity and driving the same at a high temperature to activate and diffuse the dopants to a desired depth and lateral extent. The diffusion process usually results in a tub-shaped region of one conductivity, in a region of another conductivity. Under reverse voltage conditions, the corners of such tub-shaped regions develop high electric fields and breakdown at voltages much lower than the theoretical breakdown limits for a PN junction having a radius of curvature of infinity, (i.e. an ideal PN junction). As a result, the concentration of dopants or the thicknesses of the semiconductor regions must be increased to compensate for the lowering of the breakdown voltage. Furthermore, diffusion results in a concentration gradient, which may become a factor in the design of the device. For example, a concentration gradient in the channel region may have an adverse effect on the threshold voltage and thus the turn on characteristics of a field effect transistor.

SUMMARY OF THE INVENTION

A semiconductor according to the present invention includes a common support having a support surface, a lateral semiconductor stack extending laterally along the support surface, the stack including a first semiconductor column formed over the support surface, and a second semiconductor column formed over the support surface lateral to the first semiconductor region, a first electrical contact electrically connected to the first semiconductor column, and a second electrical contact electrically connected to the second semiconductor column.

A semiconductor device according to the present invention can be a field effect transistor which includes a third semiconductor column of a conductivity opposite to the first semiconductor column and the second semiconductor column formed over the support surface and disposed laterally adjacent to the first semiconductor column and the second semiconductor column, and further comprising a gate structure adjacent the third semiconductor column.

A semiconductor device according to the present invention can also be a pin diode in which the first semiconductor column is of a first conductivity and the second semiconductor column is of a second conductivity.

According to one embodiment of the present invention the first semiconductor column is comprised of a region of one resistivity and another region of lower resistivity that is laterally adjacent the region of one resistivity both regions being disposed over the support surface. For example, in a field effect transistor according to the present invention, a drain region of lower resistivity may be laterally adjacent to a drift region of higher resistivity, or in a pin diode according to the present invention a drift region of higher resistivity may be laterally adjacent a cathode or anode region of lower resistivity.

In the preferred embodiment of the present invention the semiconductor columns are formed from conductive GaN or any other III-nitride semiconductor material. In one variation of the preferred embodiment, a semiconductor layer having a different bad gap is formed over at least one of the semiconductor columns. In another variation, the semiconductor layer is formed over the first and the second semiconductor columns. The preferred material for the semiconductor layer is AlGaN, which, when used in combination with GaN as the material for forming the semiconductor columns, may improve mobility.

According to another embodiment of the present invention a semiconductor device may include a common support having a support surface, a first semiconductor component and a second semiconductor component each including:
   a lateral semiconductor stack formed over the support surface, the stack including a first semiconductor column formed over the support surface, and a second semiconductor column formed over the support surface lateral to the first semiconductor region, whereby the stack extends laterally along the support surface, a first electrical contact electrically connected to the first semiconductor column, and
   a second electrical contact electrically connected to the second semiconductor column; and
   an insulating semiconductor column interposed between and laterally adjacent the first semiconductor component and the second semiconductor component.

In at least one of the semiconductor components, the lateral semiconductor stack may further include a third semiconductor column of a conductivity opposite to the first semiconductor column and the second semiconductor column formed over the support surface and disposed laterally adjacent to the first semiconductor column and the second semiconductor column, and a gate structure adjacent the third semiconductor column.

Alternatively, in at least one of the semiconductor components the first semiconductor column is of a first conductivity and the second semiconductor column is of a second conductivity.

A semiconductor device according to the present invention is fabricated by a method which includes forming a growth preventative layer over a major surface of a substrate, such as SiC, Si, or Sapphire, and then removing portions of the growth preventative layer to expose at least one selected portion of the major surface of the substrate, while leaving another portion of the major surface covered with the growth preventative layer. Thereafter, in an epitaxial growth step or the like, a first semiconductor column is formed on the exposed portion of the substrate. According to one aspect of the present invention, because of the presence of the growth preventative layer, the first semiconductor column is only formed vertically only over the exposed portion. The first semiconductor so formed includes an exposed sidewall. In a following growth step, another semiconductor column is formed on the exposed sidewall of the first semiconductor device, resulting in two laterally adjacent semiconductor columns. This process can be repeated as many times as desired to obtain a lateral stack of semiconductor columns of one or variable conductivities with different resistivities. The columns so formed can then serve as conductive regions for semiconductor devices such as diodes or field effect transistors.

The laterally adjacent columns as formed according to the present invention allow for better control of the concentration, dimension and shape of the junctions between the conductive regions. Thus, for example, a base region in a device according to the present invention may have a more uniform concentration. In addition, a PN junction in a device according to the present invention may have less curvature (i.e. a larger radius of curvature) and thus able to have a reverse breakdown voltage that is closer to the theoretical breakdown voltage of an ideal PN.

Advantageously, a method according to the present invention allows for the fabrication of diverse devices in a common die. That is, it allows for the fabrication of integrated devices in which different devices are formed over a common substrate. Among devices which may be fabricated according to the present invention are NPN, PNP, N-channel, or P-channel devices. Thus, a method according to the present invention can be adapted for fabrication of complimentary devices.

Other features and advantages of the present invention will become apparent from the following description of the invention which refers to the accompanying drawings.

DETAILED DESCRIPTION OF THE FIGURES

Figure 1:
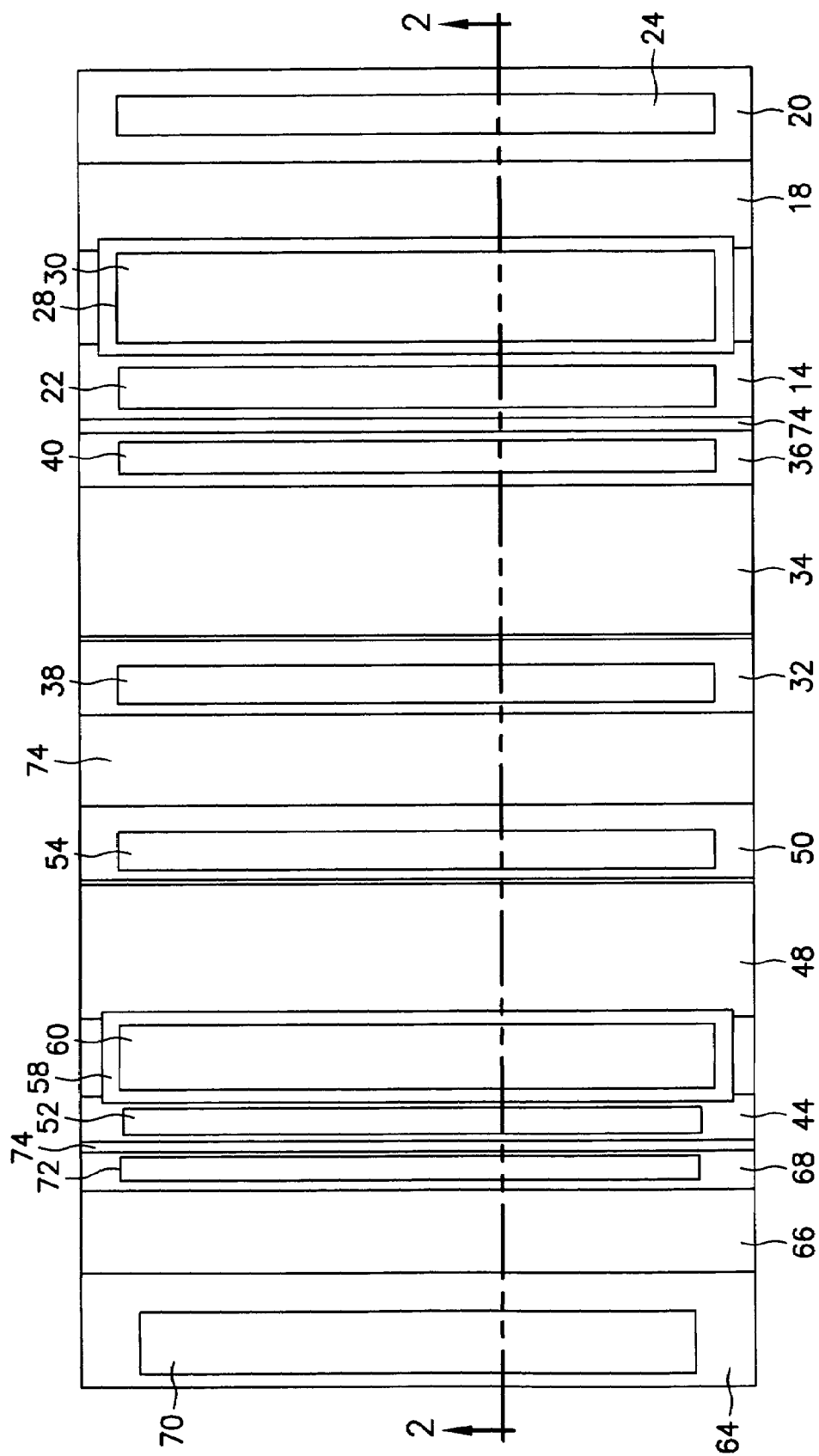
FIG. 1 is a top plan view of a device according to a first embodiment of the present invention.
Figure 2:
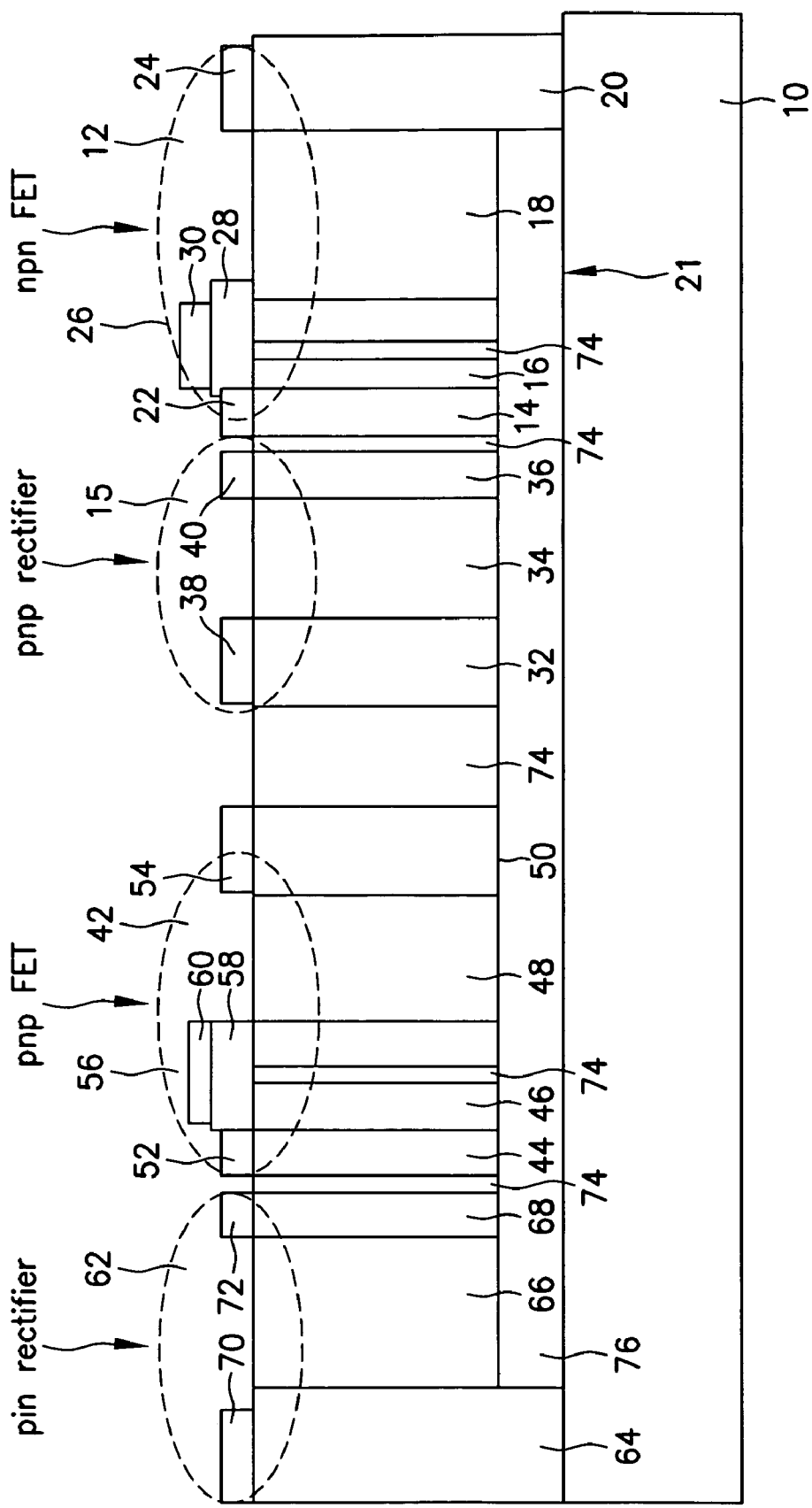
FIG. 2 is a cross-sectional view of a device according to the first embodiment of the present invention along line 2—2 and viewed in the direction of the arrows.

Referring to FIGS. 1 and 2, a device according to the first embodiment of the present invention includes a plurality of semiconductor devices formed on a common substrate 10. Substrate 10 may be composed of Sapphire, SiC, Si or any other suitable material.

First semiconductor device 12 in a device according to the present invention is an NPN field effect transistor which includes first conductive region 14 that is preferably composed of N+ GaN, base region 16 that is preferably composed of P+ GaN and laterally adjacent first conductive region 14, second conductive region 18 that is preferably composed of N or N– GaN and laterally adjacent base region 16 and third conductive region 20 that is preferably composed of N+ GaN and laterally adjacent second conductive region 18. First conductive region 14 is the source region, second conductive region 18 is the drift region and third conductive region 20 is the drain region of first semiconductor device 12. As seen in FIG. 2, each region of first device 12 is a vertically oriented column and thus extends in a direction away from the surface of substrate 10 over which it is disposed. That is, each conductive region is a vertical column which is supported over a support surface of substrate 10.

First semiconductor device 12 further includes first ohmic contact 22 (source contact) which is ohmically connected to first conductive region 14, second ohmic contact 24 (drain contact) which is ohmically connected to third conductive region 20, and gate structure 26 which is disposed over base region 16. Gate structure 26 includes gate insulation 28 composed of $SiO_2$ or any suitable insulator, and gate electrode 30.

Second semiconductor device 15 in a device according to the first embodiment of the present invention is a pin rectifier which includes first conductive region 32 that is preferably composed of P+ GaN, second conductive region 34 that is preferably composed of P– GaN and is laterally adjacent first conductive region 32 of second semiconductor device 14, and third conductive region 36 that is preferably composed of N+ GaN and is laterally adjacent to second conductive region 34. First region 32 is the anode region, second conductive region 34 is the drift region and the third conductive region 36 is the cathode region of second semiconductor device 15. Second semiconductor device 14 further includes first ohmic contact 38 (anode contact) which is ohmically connected to first conductive region 32 and second ohmic contact 40 (cathode contact) which is ohmically connected to third conductive region.

A device according to the first embodiment further includes third semiconductor device 42, which is preferably a PNP field effect transistor. Third semiconductor device 42 includes first conductive region 44 or the source region, which is preferably composed of P+ GaN, base region 46, which is preferably composed of N+ GaN and is laterally adjacent first conductive region 44, second conductive region 48 or the drift region which is composed of P– GaN and laterally adjacent base region 46, and third conductive region 50 or the drain region, which is preferably composed of P+ GaN and laterally adjacent second conductive region 48.

Third semiconductor device 42 further includes first ohmic contact 52 (source contact), which is ohmically connected to its first conductive region 44, second ohmic contact 54 (drain contact), which is ohmically connected to third semiconductor region 54, and gate structure 56 which is disposed over base region 46. Gate structure 56 includes gate insulator 58 which is composed of $SiO_2$ or any other suitable insulator and gate electrode 60.

A device according to the first embodiment of the present invention further includes fourth semiconductor device 62, which is preferably also a pin rectifier. Fourth semiconductor device 62 includes first conductive region 64 or the cathode region, which is preferably composed of N+ GaN, second conductive region 66 or the drift region, which is preferably composed of N or N– GaN and is laterally adjacent first semiconductor region 64, and third semiconductor region 68 or the anode region, which is preferably composed of P+ GaN and is laterally adjacent second conductive region 66 thereof. Fourth semiconductor device 62 further includes first ohmic contact 70 (cathode contact) which is ohmically connected to first conductive region 64 thereof, and second ohmic contact 72 (anode contact) which is ohmically connected to third conductive region 68 thereof.

In a device according to the first embodiment of the present invention, first semiconductor device 12 is disposed lateral to, but spaced from second semiconductor device 15, second semiconductor device 15 is disposed lateral to, but spaced from third semiconductor device 42, and third semiconductor device 42 is disposed lateral to, but spaced from fourth semiconductor device 62. Each semiconductor device is also electrically insulated from a laterally spaced semiconductor device by an insulating body 74, which in the preferred embodiment may be insulating GaN.

Figure 3A:
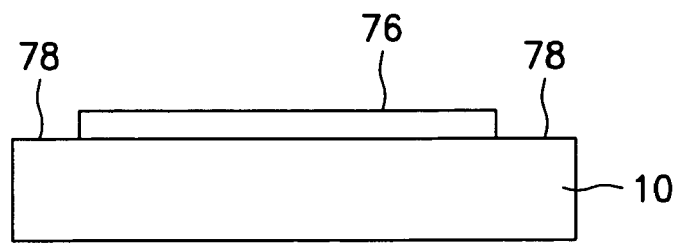
FIGS. 3A–3C illustrate an embodiment of a method for fabricating a device according to the present invention.

Referring now to FIG. 3A, to manufacture a device according to the present invention, growth inhibition layer 76 is formed over substrate 10 by first depositing a layer growth inhibiting material such as, HfO or SiO2, over a single major surface of substrate 10 and then etching selected regions thereof to ready selected regions 76 for growth of conductive regions.

Figure 3B:
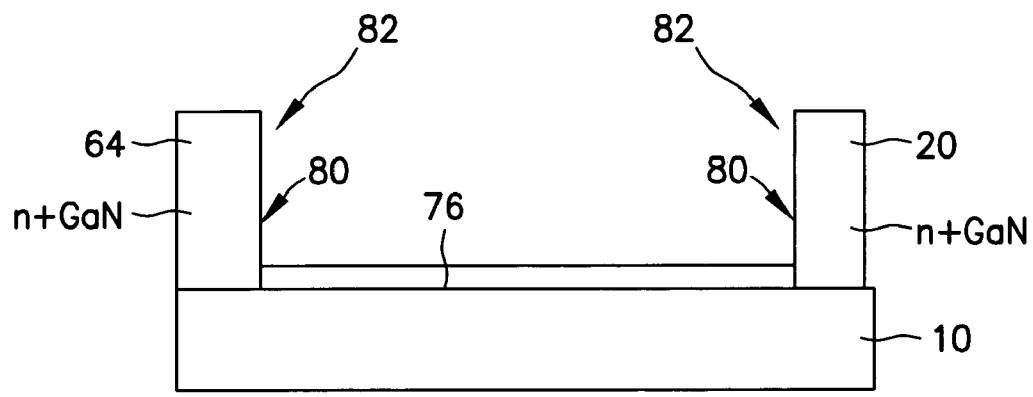

Referring to FIG. 3B, N+ GaN regions which will constitute conductive region 20 and 64 in first semiconductor device 12 and fourth semiconductor device 62 respectively, are epitaxially grown over selected regions 78 of substrate 10 which are not covered by grown inhibition layer 76. As seen in FIG. 3B, each conductive region rises above grown inhibition layer 76 and includes open surfaces 80.

Figure 3C:
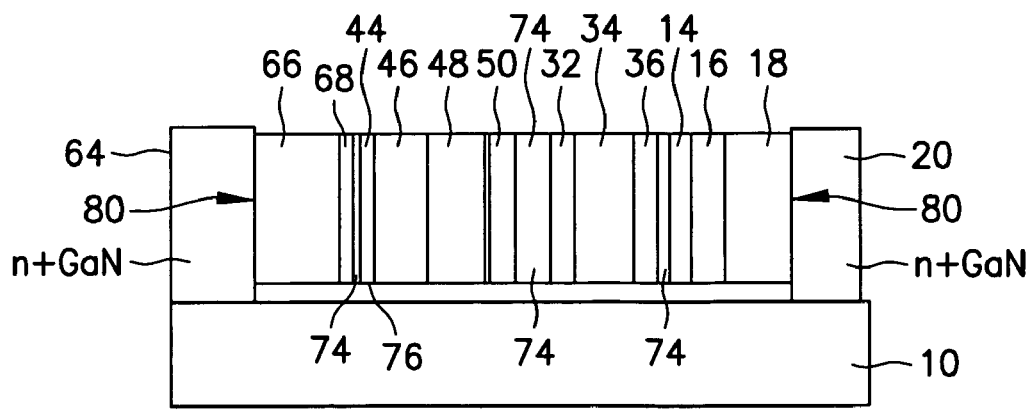

Referring next to FIG. 3C, in subsequent growth steps, the semiconductor regions which will constitute conductive regions in semiconductor devices 12, 15, 42, 62 and non-conductive regions 74 are formed in consecutive epitaxial steps. Specifically, regions 18 and 66 are formed to a desired thickness over open surfaces 80 of regions 20 and 64, respectively. As can be gathered from the Figures, regions 18 and 66 will grow laterally on open surfaces 80 of conductive regions 20, 64, respectively, and once the growth process is terminated (when a desired thickness is reached), region 8 will have a surface opposite to surface 80 of region 20 ready to receive a semiconductor layer, and region 66 will have a surface opposite to surface 80 of region 64 ready to receive a semiconductor layer. Thereafter, the semiconductor regions for a device according to the present invention are formed in the same manner until preferably gap 82 between regions 20 and 64 is filled. Thereafter, ohmic contacts and gate structures are formed where appropriate to obtain a device according to the present invention as seen, for example, in FIG. 2.

It should be noted that the columns need not be at a 90° angle with respect to substrate 10, but can be tilted to be at an angle other then 90° without deviating from the present invention.

Figure 4:
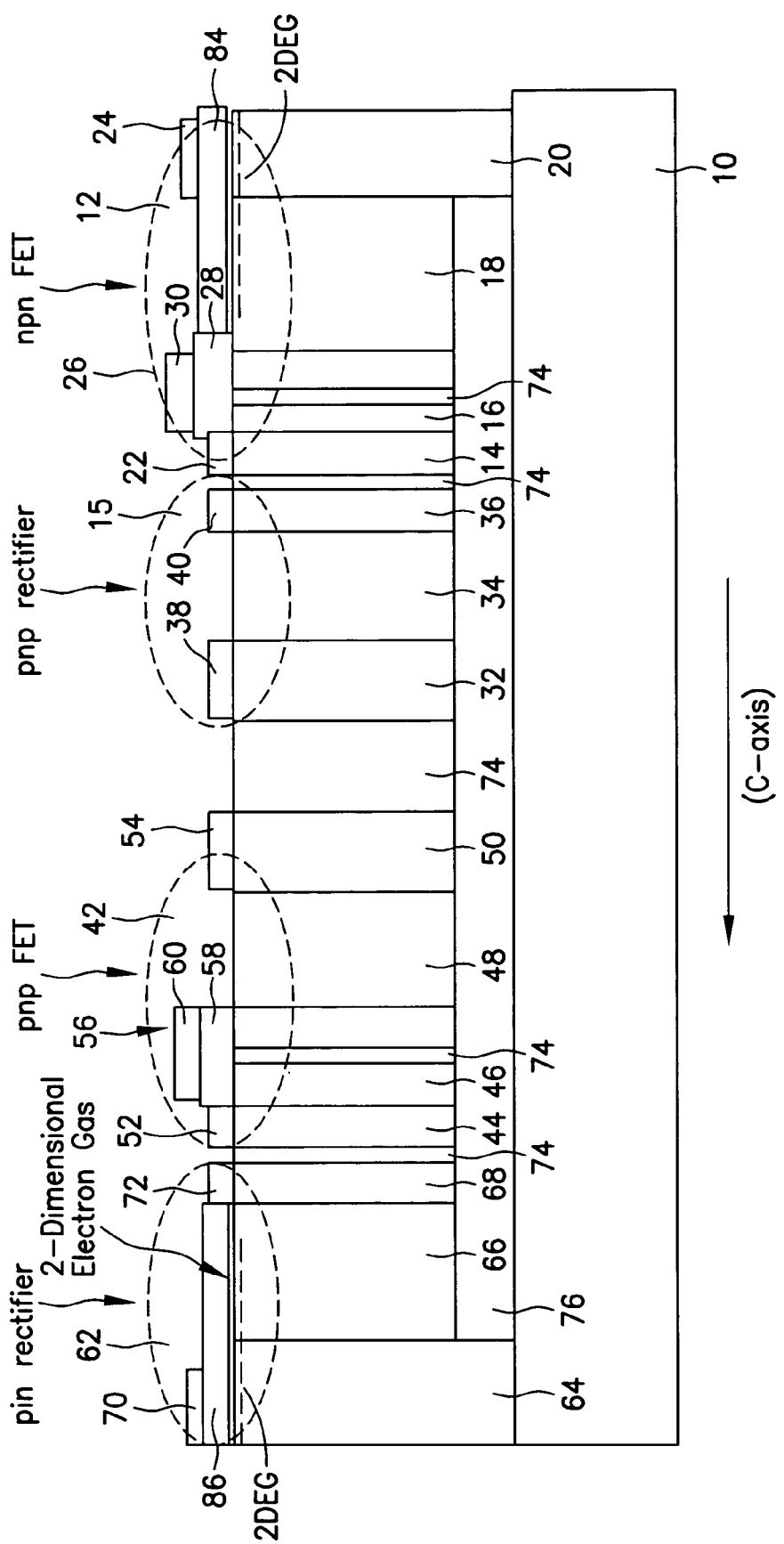
FIG. 4 is a cross-sectional view of a second embodiment of a device according to the present invention.

Referring next to FIG. 4, a device according to the second embodiment further includes semiconductor layers 84, 86 added to first semiconductor device 12 and fourth semiconductor device 62. Semiconductor layers 84, 86 are preferably composed of AlGaN. Due to the piezoelectric polarization effect a two dimensional electron gas (2DEG) is formed just below the junction between AlGaN region 84 and GaN in regions 18 and 20 of first semiconductor device 12, and the junction between AlGaN region 86 and GaN regions 64 and 66. Preferably, AlGaN regions are formed after the formation of laterally adjacent regions is completed (i.e. after the conclusion of the process described with reference to FIGS. 3A–3C). Thereafter, ohmic contacts and gate structures are formed to obtain a device according to the second embodiment of the present invention.

It should be noted that a device according to the third embodiment may include a column of insulating GaN 74 below gate structures 26, 56, which in combination with single semiconductor layer 88 that is formed from AlGaN replicate the characteristics of a standard AlGaN/GaN HFET. That is, a 2DEG is formed between AlGaN layer 88 and the insulating GaN 74 below the same.

Figure 5:
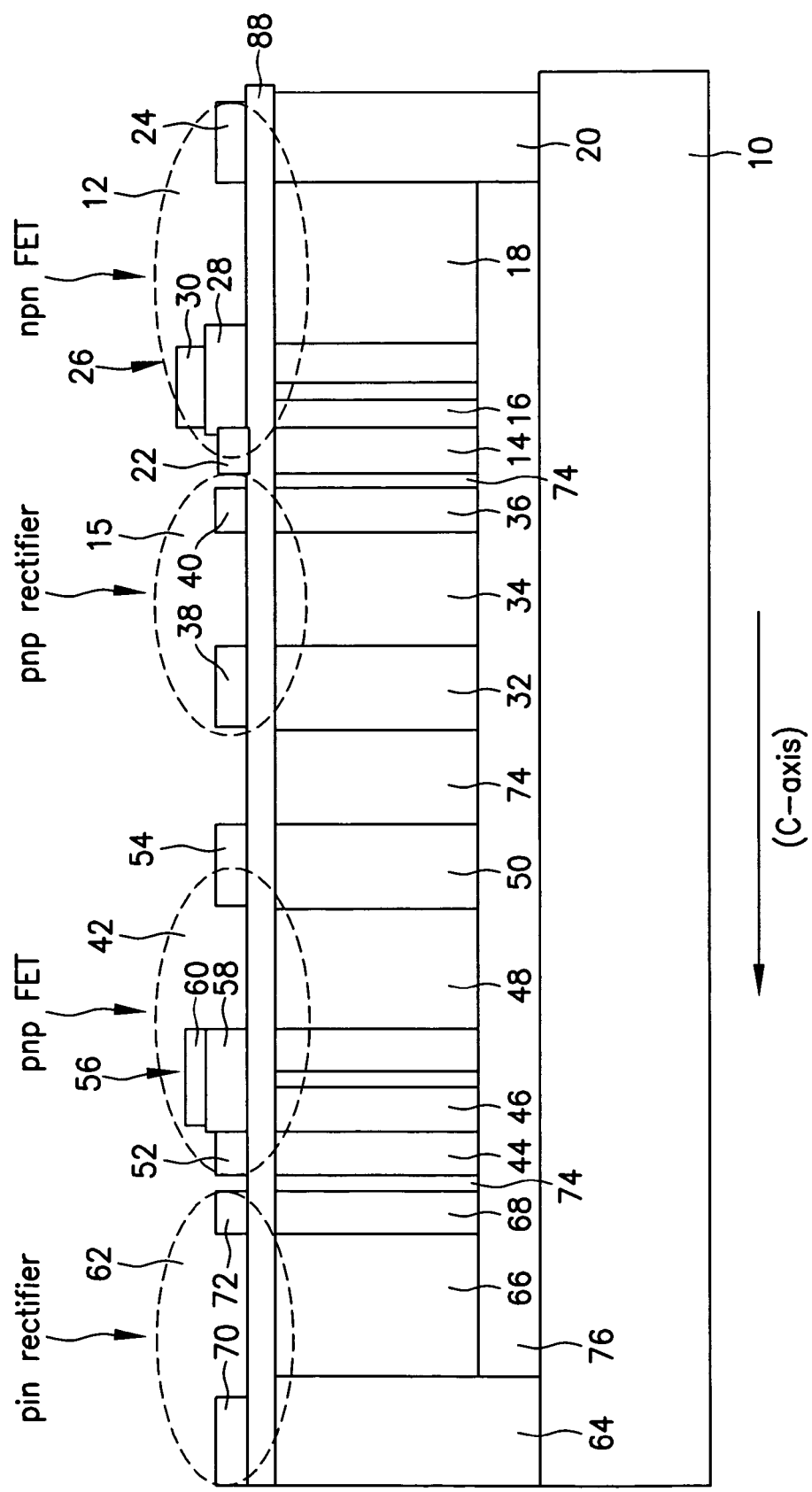
FIG. 5 is a cross-sectional view of a third embodiment of a device according to the present invention.

Referring next to FIG. 5, a third embodiment of the present invention includes a single semiconductor layer 88 extending over all of the laterally adjacent conductive regions. Single semiconductor layer 88 is preferably composed of AlGaN and is included to increase the mobility of carriers. AlGaN can be formed to take advantage of piezoelectric polarization effect. However, if piezoelectric polarization is not desired 1120 or 1100 growth directions can be used. Single semiconductor layer 88 can be epitaxially grown after the conclusion of the process described with reference to FIGS. 3A–3C. Thereafter, the ohmic contacts and the gate structures are formed to obtain a device according to the third embodiment of the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a common support having a support surface;
   a lateral semiconductor stack formed over said support surface, said stack including a first III-nitride semiconductor column formed over said support surface, and a second III-nitride semiconductor column formed over said support surface lateral to said first semiconductor region, whereby said stack extends laterally along said support surface;
   a first electrical contact electrically connected to said first semiconductor column; and
   a second electrical contact electrically connected to said second semiconductor column.

2. A semiconductor device according to claim 1, wherein said lateral semiconductor stack further comprises a third semiconductor column of a conductivity opposite to said first semiconductor column and said second semiconductor column formed over said support surface and disposed laterally adjacent to said first semiconductor column and said second semiconductor column, and further comprising a gate structure adjacent said third semiconductor column.

3. A semiconductor device according to claim 1, wherein said first semiconductor column is of a first conductivity and said second semiconductor column is of a second conductivity.

4. A semiconductor device according to claim 3, wherein said first semiconductor column is comprised of a region of one resistivity and another region of lower resistivity that is laterally adjacent said region of one resistivity both regions being disposed on said support surface.

5. A semiconductor device according to claim 1, wherein said common support comprises either Si, SiC, or sapphire.

6. A semiconductor device according to claim 1, wherein said first semiconductor column and said second semiconductor column are comprised of conductive GaN.

7. A semiconductor device according to claim 1, further comprising a semiconductor layer formed of a semiconductor of a different band gap laterally extending over at least said first semiconductor column.

8. A semiconductor device according to claim 7, wherein said first and second semiconductor columns are comprised of GaN and said semiconductor layer is comprised of AlGaN.

9. A semiconductor device according to claim 1, further comprising a semiconductor layer formed of semiconductor of a different band gap laterally extending over said first and said second semiconductor columns.

10. A semiconductor device according to claim 9, wherein said first and second semiconductor columns are comprised of GaN and said semiconductor layer is comprised of AlGaN.

11. A semiconductor device comprising:
a common support having a support surface;
a first semiconductor component and a second semiconductor component each including:
  a lateral semiconductor stack formed over said support surface, said stack including a first III-nitride semiconductor column formed over said support surface, and a second III-nitride semiconductor column formed over said support surface lateral to said first semiconductor region, whereby said stack extends laterally along said support surface;
  a first electrical contact electrically connected to said first semiconductor column; and
  a second electrical contact electrically connected to said second semiconductor column; and
an insulating semiconductor column interposed between and laterally adjacent said first semiconductor component and said second semiconductor component.

12. A semiconductor device according to claim 11, wherein said lateral semiconductor stack in at least one of said semiconductor components further comprises a third semiconductor column of a conductivity opposite to said first semiconductor column and said second semiconductor column formed over said support surface and disposed laterally adjacent to said first semiconductor column and said second semiconductor column, and further comprising a gate structure adjacent said third semiconductor column.

13. A semiconductor device according to claim 11, wherein in at least one of said semiconductor components said first semiconductor column is of a first conductivity and said second semiconductor column is of a second conductivity.

14. A semiconductor device according to claim 13, wherein said first semiconductor column in each semiconductor component is comprised of a region of one resistivity and another region of lower resistivity that is laterally adjacent said region of one resistivity both regions being disposed on said support surface.

15. A semiconductor device according to claim 11, wherein said common support comprises either Si, SiC, or sapphire.

16. A semiconductor device according to claim 11, wherein said first semiconductor column and said second semiconductor column are comprised of conductive GaN.

17. A semiconductor device according to claim 11, further comprising a semiconductor layer formed of a semiconductor of a different band gap laterally extending over at least said first semiconductor column.

18. A semiconductor device according to claim 17, wherein said first and second semiconductor columns are comprised of GaN and said semiconductor layer is comprised of AlGaN.

19. A semiconductor device according to claim 11, further comprising a semiconductor layer formed of semiconductor of a different band gap laterally extending over said first and said second semiconductor columns.

20. A semiconductor device according to claim 19, wherein said first and second semiconductor columns are comprised of GaN and said semiconductor layer is comprised of AlGaN.

21. A semiconductor device according to claim 11, wherein said insulating semiconductor column is comprised of nonconductive GaN.

* * * * *

UNITED STATES PATENT AND TRADEMARK OFFICE
CERTIFICATE OF CORRECTION

PATENT NO.        : 7,205,657 B2                                              Page 1 of 1
APPLICATION NO.   : 11/056833
DATED             : April 17, 2007
INVENTOR(S)       : Robert Beach and Paul Bridger It is certified that error appears in the above-identified patent and that said Letters Patent is hereby corrected as shown below:

On the title page

Item (54) - the title should read

--COMPLIMENTARY LATERAL III-NITRIDE TRANSISTORS--

Signed and Sealed this

Sixteenth Day of October, 2007

JON W. DUDAS
*Director of the United States Patent and Trademark Office*